United States Patent [19]

Hsue et al.

[11] Patent Number: 5,374,565
[45] Date of Patent: Dec. 20, 1994

[54] METHOD FOR ESD PROTECTION IMPROVEMENT

[75] Inventors: Chen-Chiu Hsue; Joe Ko, both of Hsinchu, Taiwan, Prov. of China

[73] Assignee: United Microelectronics Corporation, Hsinchu, Taiwan, Prov. of China

[21] Appl. No.: 139,858

[22] Filed: Oct. 22, 1993

[51] Int. Cl.$^5$ .......................................... H01L 21/266
[52] U.S. Cl. ........................................ 437/30; 437/45; 437/150
[58] Field of Search ...................... 437/29, 30, 34, 45, 437/149, 150; 148/DIG. 13

[56] References Cited

U.S. PATENT DOCUMENTS

| | | | |
|---|---|---|---|
| 4,649,629 | 3/1987 | Miller et al. | 437/45 |
| 4,968,639 | 11/1990 | Bergonzoni | 437/150 |
| 5,077,590 | 12/1991 | Fujihira | 357/23.13 |
| 5,142,345 | 8/1992 | Miyata | 357/23.13 |
| 5,234,853 | 8/1993 | Ikemasu | 437/30 |
| 5,272,097 | 12/1993 | Shiota | 437/34 |

*Primary Examiner*—Brian E. Hearn
*Assistant Examiner*—Chandra Chaudhari
*Attorney, Agent, or Firm*—George O. Saile; Stephen B. Ackerman

[57] ABSTRACT

A method of forming an ESD protection device with reduced junction breakdown voltage, simultaneously with an integrated circuit which includes FET devices, and the resultant device structure, are described. A silicon substrate is provided on which there are field oxide regions, gates, and active regions. A first ion implant of a conductivity-imparting dopant is performed in a vertical direction into the active regions of the ESD protection device and the FET devices. A first insulating layer is formed over the ESD protection device and the FET devices, and over the field oxide regions. The first insulating layer is patterned to create spacers adjacent to the gates of both the ESD protection device and the FET devices. A second ion implant of a conductivity-imparting dopant with higher concentration than dopant from the first ion implant is performed into active regions of both the ESD protection device and the FET devices. A second insulating layer is formed over the ESD protection device and the FET devices, and over the field oxide regions. The second insulating layer is patterned to form contact openings to the active regions. Finally, a third ion implant of a conductivity-imparting dopant, with opposite conductivity from the first and second ion implants, having equal concentration to dopant from the first ion implant, is performed through the contact openings into active regions of the ESD protection device.

6 Claims, 5 Drawing Sheets

METHOD FOR ESD PROTECTION IMPROVEMENT

RELATED PATENT APPLICATION

1) "Method of Improvement for LDD Process", inventor C. C. Hsue, Ser. No. 08/131,373, filed Oct. 4, 1993.

BACKGROUND OF THE INVENTION (1) Field of the Invention

The invention relates to the manufacture of highly dense integrated circuits, and more particularly to input protection devices to protect attached integrated circuits from damage due to electrostatic discharge.

(2) Description of the Related Art

During handling and operation of integrated circuit devices using Field Effect Transistor (FET) technology, large electrostatic charges can be transferred from external contacts of the integrated circuit into the interior of the circuit, causing damage and/or destruction to FET devices within. In order to prevent such damage, workers in the field have added input protection devices which are typically located between the external contacts and the FET devices. These protection devices are designed to provide a path to safely discharge the electrostatic charge and prevent damage to the internal FET devices.

One such device is shown in U.S. Pat. No. 5,142,345 by Miyata. In this invention, an input protection device is formed and later connected to an internal FET device and a memory structure, which it is designed to protect from electrostatic discharge (ESD). The input protection device is itself an FET device. The protection device's source/drain regions are formed with a single heavy ion implant during separate processing steps from the formation of the source/drain regions for the connected internal devices. Spacers are formed on the gates of both the internal and the protection devices, since the internal devices are formed using LDD (lightly doped drain) regions that require the spacers form one ion implant step.

Another such device is shown in U.S. Pat. No. 5,077,590 by Fujihira, and consists of a high voltage semiconductor device with an integrated Zener diode.

SUMMARY OF THE INVENTION

It is a principal object of this invention to provide a method for forming an ESD protection device with a reduced junction breakdown voltage which improves the ESD characteristics of the protection device.

This object is achieved by forming an ESD protection device with reduced junction breakdown voltage, simultaneously with an integrated circuit which includes FET devices, on a silicon substrate on which there are field oxide regions, gates, and active regions. A first ion implant of a conductivity-imparting dopant is performed in a vertical direction into the active regions of the ESD protection device and the FET devices. A first insulating layer is formed over the ESD protection device and the FET devices, and over the field oxide regions. The first insulating layer is patterned to create spacers adjacent to the gates of both the ESD protection device and the FET devices. A second ion implant of a conductivity-imparting dopant with higher concentration than dopant from the first ion implant is performed into active regions of both the ESD protection device and the FET devices. A second insulating layer is formed over the ESD protection device and the FET devices, and over the field oxide regions. The second insulating layer is patterned to form contact openings to the active regions. Finally, a third ion implant of a conductivity-imparting dopant, with opposite conductivity from the first and second ion implants, having equal concentration to dopant from the first ion implant, is performed through the contact openings into active regions of the ESD protection device.

It is a further object of this invention to provide a structure of an ESD protection device with a reduced junction breakdown voltage which improves the ESD characteristics of the protection device.

This object is achieved by providing field oxide regions that are located in and on a silicon substrate, for isolation of the ESD protection devices and the FET devices. Gates with adjacent spacers for the ESD protection device are formed between the field oxide regions. Source/drain regions for the ESD protection device are located between the gate and the field oxide regions, and have a first lightly implanted region under the spacers, a heavier implanted region of the same conductivity as the light ion implant between the first lightly implanted region and the field oxide regions, and a second lightly implanted region of opposite conductivity centered under the heavier implanted region.

DESCRIPTION OF THE PREFERRED EMBODIMENTS

Figure 1:
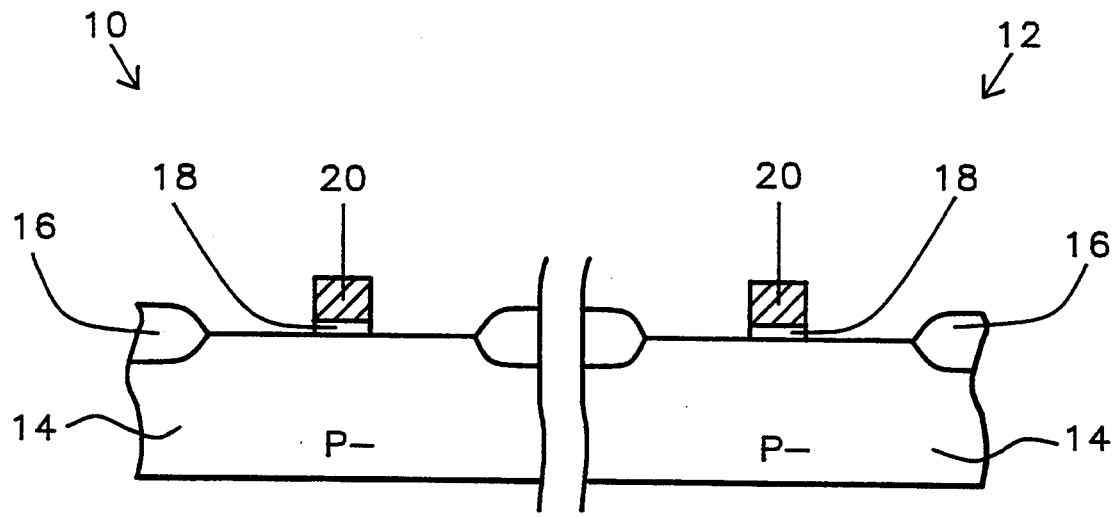
FIGS. 1 to 7 are cross-sectional views of the method, and resultant structure, of the invention for forming an ESD protection device to protect an attached integrated circuit from damage due to electrostatic discharge.

Referring now to FIG. 1, there is shown an ESD protection device 10 and an internal FET device 12. Both devices are formed at the same time on a single P− substrate 14. Field oxide regions 16 are formed in a conventional manner, for example, by the LOCOS (LOCal Oxidation of Silicon) technique, and serve to isolate devices from one another. A gate oxide layer is formed by thermal growth of the silicon substrate, as is well know in the art, to a thickness of between about 70 and 350 Angstroms. A gate layer is then deposited conformally, to a thickness of between about 1500 and 4500 Angstroms, and is typically a polysilicon or polycide. The gate layer is then patterned by conventional lithography and etching, to form a gate electrode for each device consisting of gate oxide 18 and gate 20.

Figure 2:
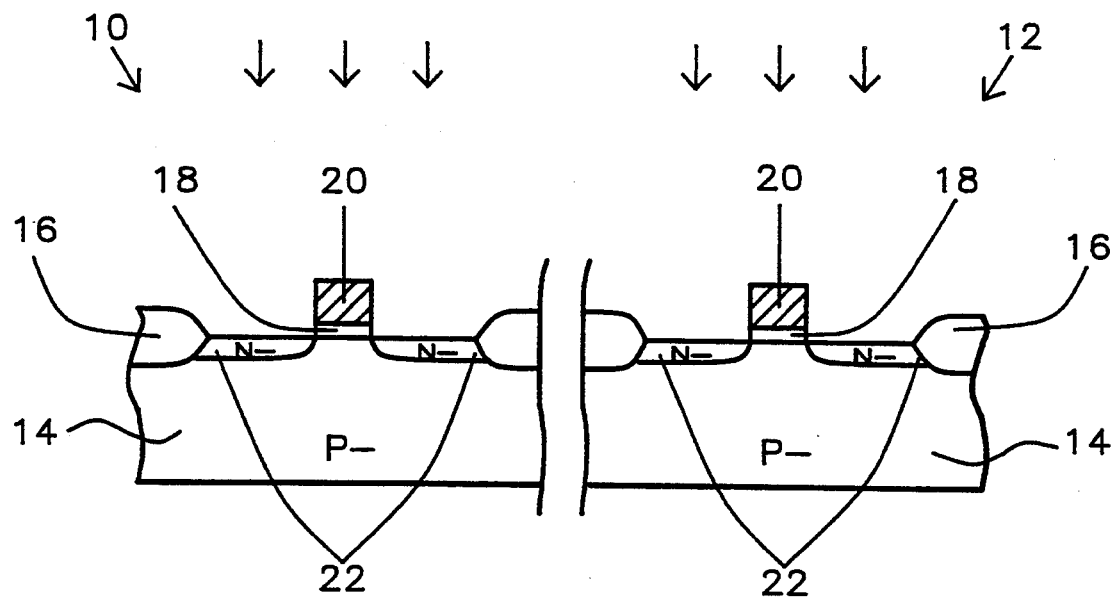

With reference to FIG. 2, a first ion implant is performed using phosphorus P31 at a concentration of between about 1 E 13 and 1 E 14 atoms/cm.$^2$. This forms N− regions 22, in the source and drain regions of the protection device 10 and internal FET device 12, with the N− regions being self-aligned due to the use of the gate as a mask.

Figure 3:
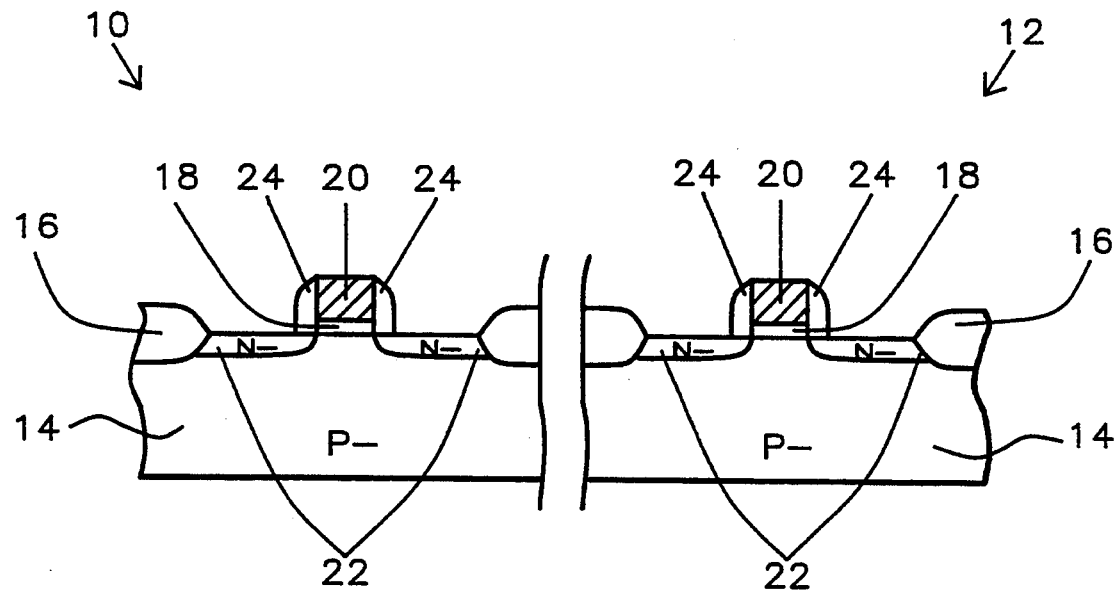

Referring now to FIG. 3, a conformal insulating layer of, for instance, silicon oxide, is deposited over the entire work surface by chemical vapor deposition (CVD) to a thickness of between about 1000 and 3000 Angstroms. This layer can also be a nitride or polysilicon. The layer is then patterned by an anisotropic reactive ion etch to form spacers 24 on the sides of the device gates, as is well known in the art.

Figure 4:
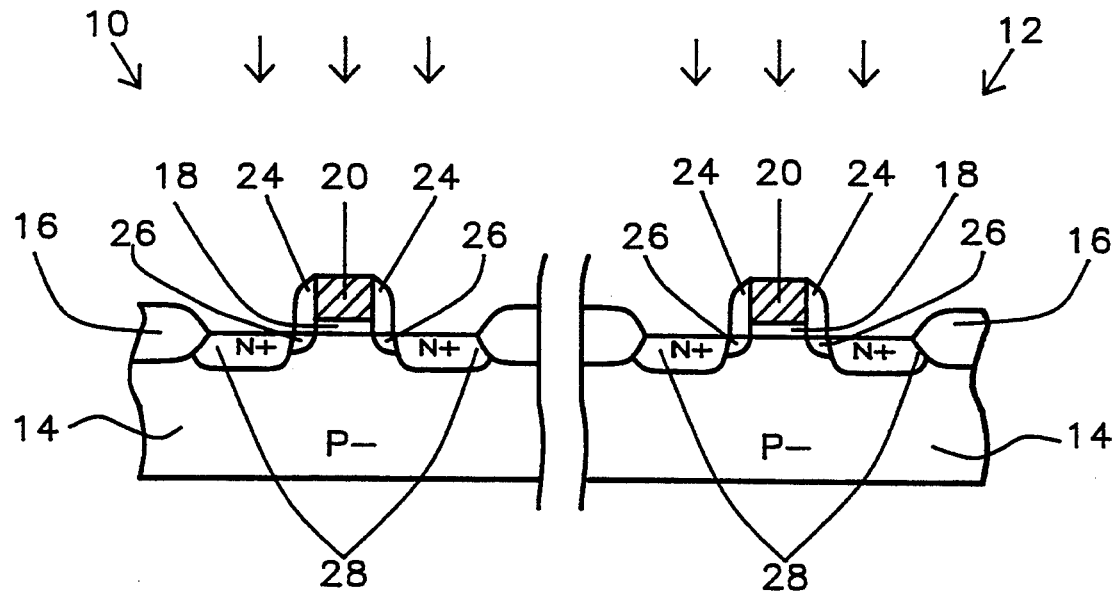

As shown in FIG. 4, a heavy ion implant is now performed, using arsenic AS75 at a dosage of between about 1 E 15 and 6 E 15 atoms/cm.$^2$. A drive-in step is then performed by heating to a temperature of between about 750° and 950° C. for between about 10 and 60 minutes. Due to the drive-in, the resultant source/drain regions have a lightly doped drain (LDD) structure, as shown in FIG. 4 and as is well known in the art, with N− regions 26 under spacers 24, and N+ regions 28.

Figure 5:
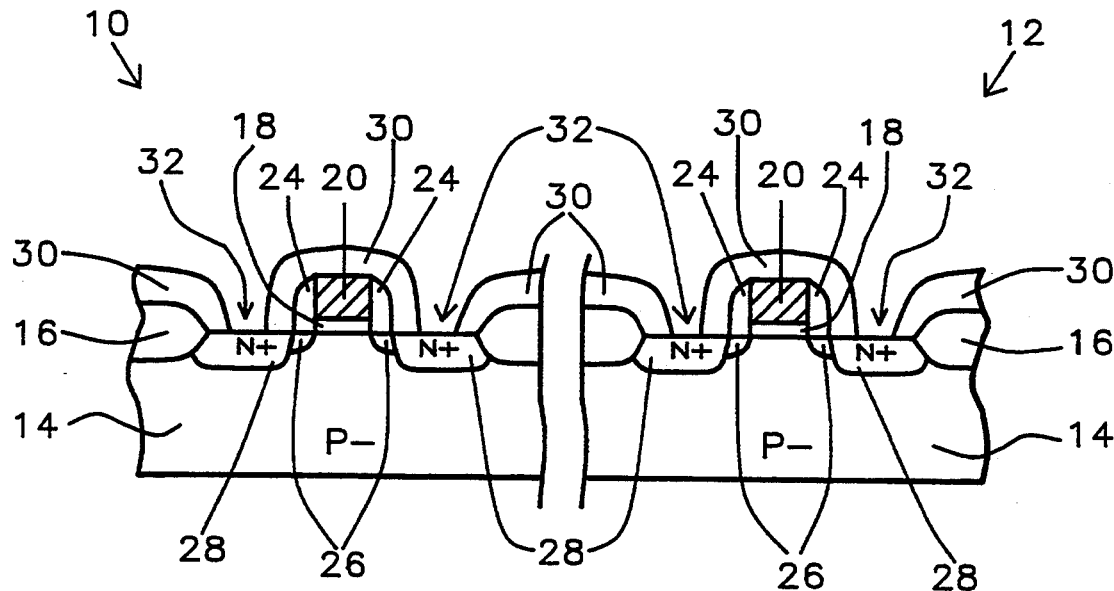

Referring now to FIG. 5, an insulating layer 30 is formed over the entire structure by depositing borophosphosilicate glass (BPSG) to a thickness of between about 3000 and 10,000 angstroms. This layer is then reflowed to make it more planar by heating the structure to a temperature of between about 750° and 1000° C. for between about 10 and 60 minutes. The BPSG layer 30 is then patterned by conventional lithography and etching to form contact openings 32. Layer 30 could alternately be formed of polyphosilicate glass (PSG).

Figure 6:
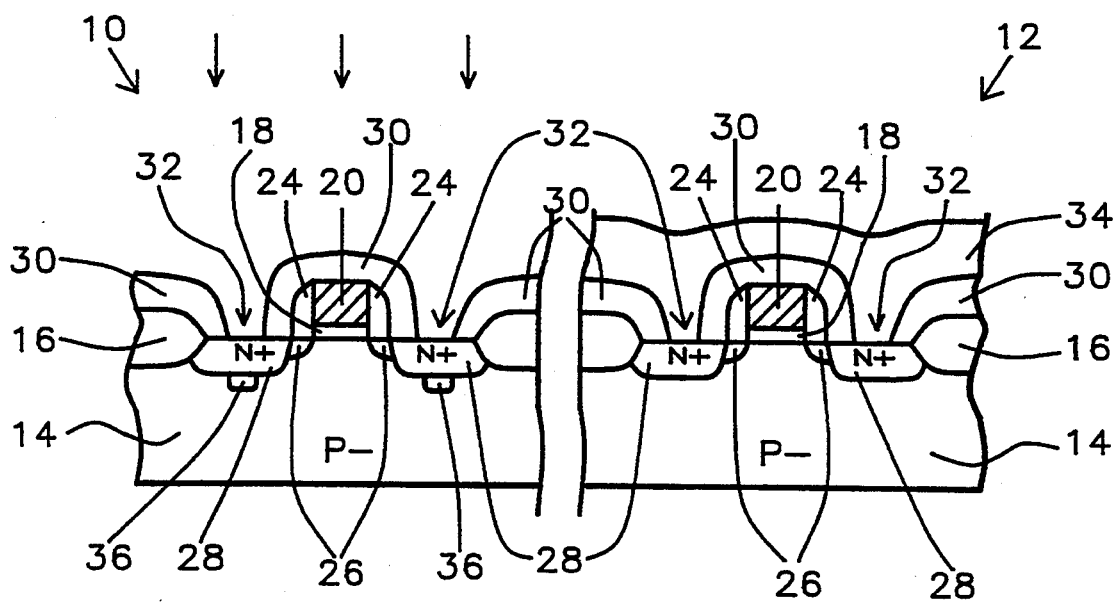

With reference to FIG. 6, the critical step of the invention is not performed. A photoresist 34 is formed and patterned with conventional lithography and development as is well known in the art to mask the internal device 12. A light ion implant is then performed through contact openings 32 into the active regions of the ESD protection device 10. This implant is of an opposite conductivity (P−) to that of the existing source/drain region 28. The implant is performed with boron B11 at a concentration of between about 2 E 13 and 2 E 14 atoms/cm.$^2$, and forms P− regions 36 under N+ regions 28. The implant has the effect of reducing the junction breakdown voltage of the device from a normal range of between about 10 and 14 volts, to a lower value of between about 5 and 8 volts.

The addition of the P− regions 36 reduces the breakdown voltage because the breakdown voltage of a p-n junction is inversely proportional to the substrate impurity concentration, as explained in "Physics and Technology of Semiconductor Devices, A. S. Grove, pp. 194-195, published by John Wiley & Sons, 1967. Adding region 36 increases the substrate impurity concentration at the p-n junctions between the ESD device active regions and the substrate, and thus decreases the junction breakdown voltage.

The reduction in junction breakdown voltage improves the ESD characteristics of the device since it allows more current to be discharged through the protection device for a given amount of power. Fast power dissipation in the ESD protection device is required, in order to prevent damage to the internal devices. Given that power is defined as $$P = I*V$$

where P is power, I is the discharge current, and V is the junction breakdown voltage, it can be seen that a lower voltage will allow more current to be discharged for a given amount of power associated with an ESD charge.

Figure 7:
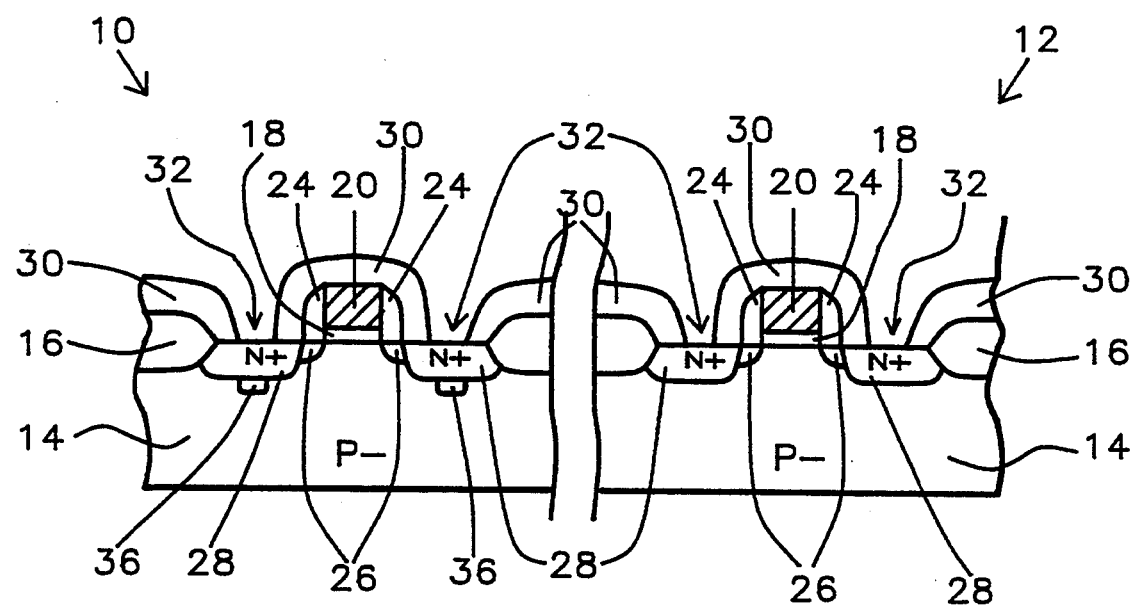

The resultant structure, after removal of resist 34, is shown in FIG. 7. Further processing then takes place to complete the circuit, by continuing with processing as is well known in the art, e.g., forming contacts to the active regions of the devices, metallization, passivation, etc. These steps are not described further as they are not important to the invention.

The invention has the following additional advantages: (1) A medium current implant can be used, instead of a high current implant; (2) product ESD adjustment cycle time is shortened and flexible; (3) there is not effect on output device performance; (4) and there is minimal capacitance increase. Regarding (1), in the conventional process a final high current implant is typically used to compensate the LDD N− dosage to improve the ESD discharge path, while in the invention a lower current implant (the implant in with P− regions 36 are created) is used. With regard to (2), because the invention allows for adjustment of the ESD characteristics after contact formation, as opposed to the extra implant step as in the conventional process, the ESD adjustment cycle time is more flexible.

Regarding output device performance, in the related art a non-LDD source/drain region is formed in the ESD device, which results in degraded device reliability due to problems with the hot-electron effect. The use of a lightly doped drain in the invention prevents this problem. And since the final ion implant of the invention effects a small area of the source/drain regions, as compared to the prior art ESD implant in which the entire source/drain region receives an implant, there is a reduced junction capacitance increase.

While the above method was described with respect to an NMOS device in which N implants were used with a P− substrate, and there was the inventive step of the final P− implant, it would be well understood by those skilled in the art that a PMOS device could similarly have been formed by using an N substrate, dopants of an opposite conductivity to form P-doped source/drain regions, and the final implant of the invention to form an N− region. This would be accomplished by a first ion implant with boron B11 at a dosage of between about 5 E 12 and 5 E 13 atoms/cm.$^2$, and the second ion implant with boron B11 at a dosage of between about 1 E 15 and 6 E 15 atoms/cm.$^2$. The critical final ion implant of the invention would be with phosphorus P31 at a dosage of between about 2 E 13 and 2 E 14 atoms/cm.$^2$.

The invention has can also be used for CMOS devices. The NMOS device described with reference to FIGS. 1 to 7 could be combined with a similarly formed (though with dopants of opposite conductivity) PMOS device to form a CMOS structure wherein the source/drain regions of the CMOS ESD protection device would have the reduced junction breakdown voltage of the invention to improve ESD characteristics.

Figure 8:
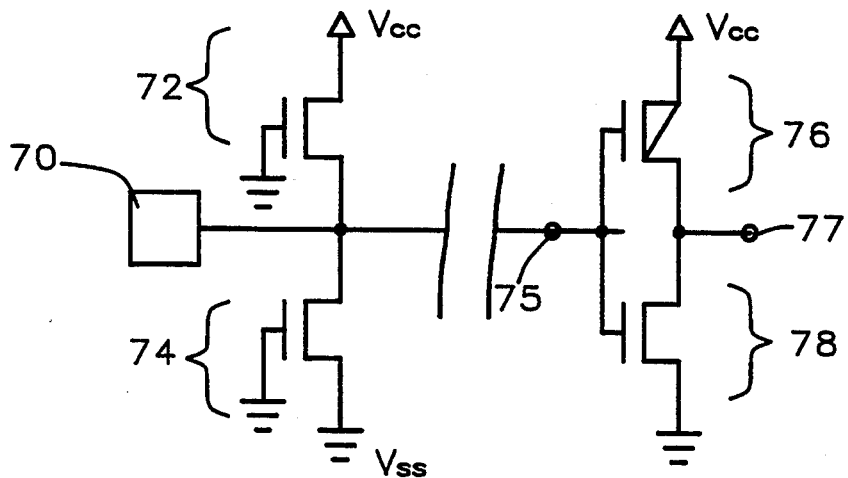
FIGS. 8 and 9 are a circuit schematic and the associated cross-sectional view, respectively, of an ESD protection device formed by the inventive method, and an associated internal CMOS device.

The invention can be more fully understood by referring to the circuit diagram of FIG. 8. An ESD protection device 40, made by the inventive method, is shown connected to input, or output, (I/O) pad 70, and consists of two NMOS devices. It is through the pad 70 that electrostatic charges may enter the integrated circuit from an exterior source such as a person handling the device. The NMOS transistor 72 has its source connected to Vcc, a voltage source. The NMOS 72 drain is connected to the drain of the NMOS transistor 74, and to the I/O pad 70, as well as to the internal circuit the ESD device is designed to protect. The NMOS transistor 74 has its gate and source connected to ground.

Figure 9:
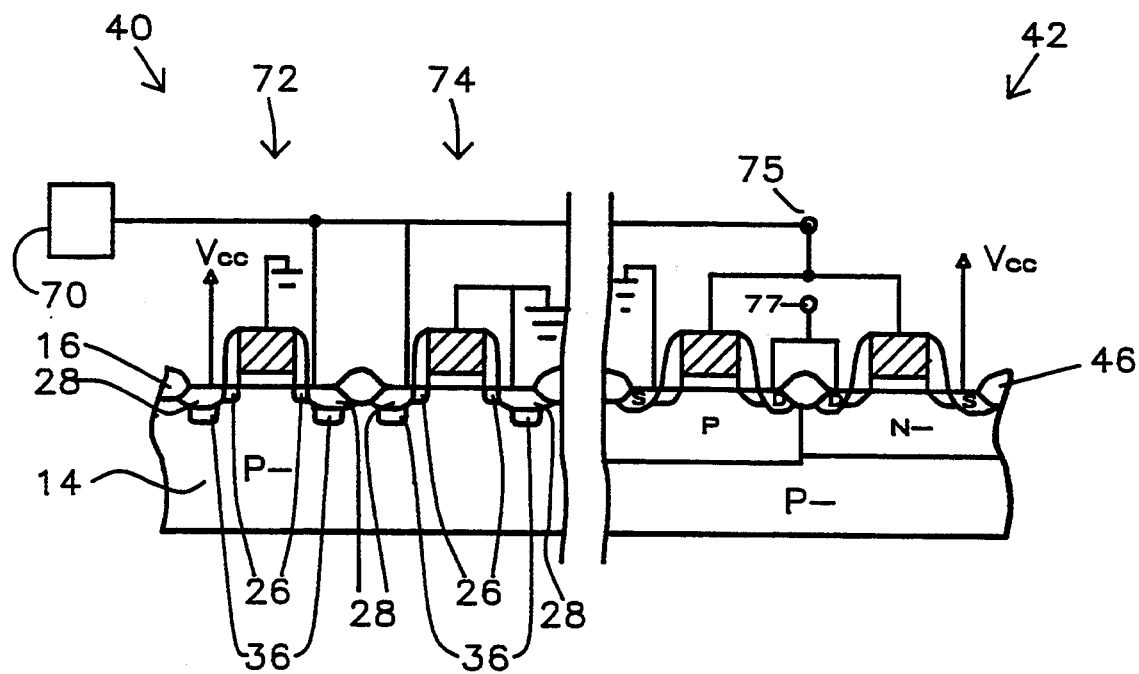

A CMOS inverter is shown as internal CMOS device 42, through other circuit structures could also be protected by the ESD protection device of the invention. This inverter has its input 75 connected to the gates of P-channel transistor 76 and N-channel transistor 78. The P-channel source is connected to Vcc, while the N-channel source is connected to ground. The drains of the two transistors are connected together and provide the output terminal of the inverter. A cross-sectional representation of the FIG. 8 circuit, and connections, is shown in FIG. 9, wherein similar elements from earlier figures are given the same numbers. The key element of the lightly doped P— regions 36 are shown, and provide the lower junction breakdown voltage and subsequent improved ESD characteristics of the invention.

While the invention has been particularly shown and described with reference to the preferred embodiments thereof, it will be understood by those skilled in the art that various changes in form and details may be made without departing from the spirit and scope of the invention.

What is claimed is:

1. A method of forming an ESD protection device with reduced junction breakdown voltage, simultaneously with an integrated circuit which includes FET devices, on a silicon substrate on which there are field oxide regions, gates, and active regions, comprising the steps of:
   performing a first ion implant in a vertical direction of a conductivity-imparting dopant into said active regions of the ESD protection device and the FET devices;
   forming a first insulating layer over said ESD protection device and said FED devices, and over said field oxide regions;
   patterning said first insulating layer to create spacers adjacent to said gates of both said ESD protection device and said FET devices;
   performing a second ion implant in a vertical direction of a conductivity-imparting dopant with higher concentration than dopant from said first ion implant, into active regions of both said ESD protection device and said FET devices;
   forming a second insulating layer over said ESD protection device and said FET devices, and over said field oxide regions;
   patterning said second insulating layer to form contact openings to said active regions; and
   performing a third ion implant in a vertical direction of a conductivity-imparting dopant with opposite conductivity from said first and second ion implants, having equal concentration to dopant from said first ion implant, through said contact openings into active regions of said ESD protection device.

2. The method of claim 1 wherein said third ion implant is with boron B11 at a dosage of between about 2 E 13 and 2 E 14 atoms/cm.$^2$.

3. The method of claim 2 wherein said first ion implant is with phosphorus P31 at a dosage of between about 1 E 14 and 1 E 15 atoms/cm.$^2$, and said second ion implant is with arsenic AS75 at a dosage of between about 1 E 15 and 6 E 15 atoms/cm.$^2$.

4. The method of claim 1 wherein and said third ion implant is with phosphorus P31 at a dosage of between about 2 E 13 and 2 E 14 atoms/cm.$^2$.

5. The method of claim 4 wherein said first ion implant is with boron B11 at a dosage of between about 5 E 12 and 5 E 13 atoms/cm.$^2$, and said second ion implant is with boron B11 at a dosage of between about 1 E 15 and 6 E 15 atoms/cm.$^2$.

6. A method of forming an ESD protection device with reduced junction breakdown voltage, on a silicon substrate on which there are field oxide regions, gates, and active regions, comprising the steps of:
   performing a first ion implant in a vertical direction of a conductivity-imparting dopant into said active regions of the ESD protection device;
   forming a first insulating layer over said ESD protection device and over said field oxide regions;
   patterning said first insulating layer to create spacers adjacent to said gates of said ESD protection device;
   performing a second ion implant in a vertical direction of a conductivity-imparting dopant with higher concentration than dopant from said first ion implant, into active regions of said ESD protection device;
   forming a second insulating layer over said ESD protection device and over said field oxide regions;
   patterning said second insulating layer to form contact openings to said active regions; and
   performing a third ion implant in a vertical direction of a conductivity-imparting dopant with opposite conductivity from said first and second ion implants, having equal concentration to dopant from said first ion implant, through said contact openings into active regions of said ESD protection device.

* * * * *